United States Patent
Yoshihara et al.

(10) Patent No.: US 12,283,458 B2
(45) Date of Patent: Apr. 22, 2025

(54) CHARGED PARTICLE BEAM DEVICE

(71) Applicant: Hitachi High-Tech Corporation, Tokyo (JP)

(72) Inventors: Mai Yoshihara, Tokyo (JP); Hirotsugu Kajiyama, Tokyo (JP); Hiroyuki Chiba, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 445 days.

(21) Appl. No.: 17/910,875

(22) PCT Filed: Mar. 18, 2020

(86) PCT No.: PCT/JP2020/012094
§ 371 (c)(1),
(2) Date: Sep. 12, 2022

(87) PCT Pub. No.: WO2021/186637
PCT Pub. Date: Sep. 23, 2021

(65) Prior Publication Data
US 2023/0105549 A1   Apr. 6, 2023

(51) Int. Cl.
*H01J 37/21* (2006.01)
*H01J 37/06* (2006.01)
(Continued)

(52) U.S. Cl.
CPC ............. *H01J 37/21* (2013.01); *H01J 37/06* (2013.01); *H01J 37/222* (2013.01);
(Continued)

(58) Field of Classification Search
CPC .. H01J 37/00; H01J 37/02; H01J 37/20; H01J 37/21; H01J 37/06; H01J 37/222;
(Continued)

(56) References Cited

U.S. PATENT DOCUMENTS 3,924,156 A * 12/1975 Doran ................... H05B 3/56
                                                    315/382
4,180,738 A * 12/1979 Smith .................. H01J 37/153
                                                    250/311
(Continued)

FOREIGN PATENT DOCUMENTS

JP    2005-201810 A    7/2005
JP    2005-285746 A    10/2005
(Continued)

OTHER PUBLICATIONS

International Search Report (PCT/ISA/210) issued in PCT Application No. PCT/JP2020/012094 dated Jun. 9, 2020 with English translation (four (4) pages).
(Continued)

*Primary Examiner* — Jason L McCormack
(74) *Attorney, Agent, or Firm* — Crowell & Moring LLP

(57) ABSTRACT

There is provided a technique capable of shortening a photographing time and obtaining a more accurate photographed image when photographing a sample SAM using a charged particle beam device 1. The charged particle beam device 1 includes an electron gun 3, an objective lens 6, a stage 8, detectors 10 and 11, an integrated control unit C0, a photographing function, and an autofocus function. Each of a plurality of photographing visual fields is focused in a focus value calculation visual field 64 adjacent to a designated visual field 61 designated as a photographing target among the plurality of photographing visual fields, and a focus value calculated in the focus value calculation visual field 64 is used for calculating focus values of each of the plurality of photographing visual fields.

13 Claims, 15 Drawing Sheets

(51) Int. Cl.
  *H01J 37/22* (2006.01)
  *H01J 37/244* (2006.01)
  *H01J 37/26* (2006.01)
  *H01J 37/28* (2006.01)

(52) U.S. Cl.
  CPC .......... *H01J 37/244* (2013.01); *H01J 37/265* (2013.01); *H01J 37/28* (2013.01); *H01J 2237/216* (2013.01)

(58) Field of Classification Search
  CPC ........ H01J 37/244; H01J 37/265; H01J 37/28; H01J 37/26
  USPC .................................. 250/306, 307, 310, 311
  See application file for complete search history.

(56) References Cited

U.S. PATENT DOCUMENTS

| | | | | |
|---|---|---|---|---|
| 6,107,637 | A * | 8/2000 | Watanabe | H01J 37/222 250/548 |
| 2004/0069956 | A1* | 4/2004 | Takane | G06T 7/62 250/307 |
| 2005/0194533 | A1 | 9/2005 | Okuda et al. | |
| 2005/0258366 | A1* | 11/2005 | Honda | H01J 37/21 250/310 |
| 2007/0194233 | A1 | 8/2007 | Motoki | |
| 2009/0084953 | A1 | 4/2009 | Harada et al. | |
| 2012/0305797 | A1* | 12/2012 | Preikszas | H01J 37/28 250/397 |
| 2013/0216141 | A1* | 8/2013 | Ushiba | H01J 37/28 382/218 |
| 2014/0021350 | A1* | 1/2014 | Nishihama | H01J 37/28 250/310 |

FOREIGN PATENT DOCUMENTS

| | | |
|---|---|---|
| JP | 2007-212288 A | 8/2007 |
| JP | 2009-85657 A | 4/2009 |
| JP | 2010-244740 A | 10/2010 |

OTHER PUBLICATIONS

Japanese-language Written Opinion (PCT/ISA/237) issued in PCT Application No. PCT/JP2020/012094 dated Jun. 9, 2020 (three (3) pages).

* cited by examiner

[FIG. 1]
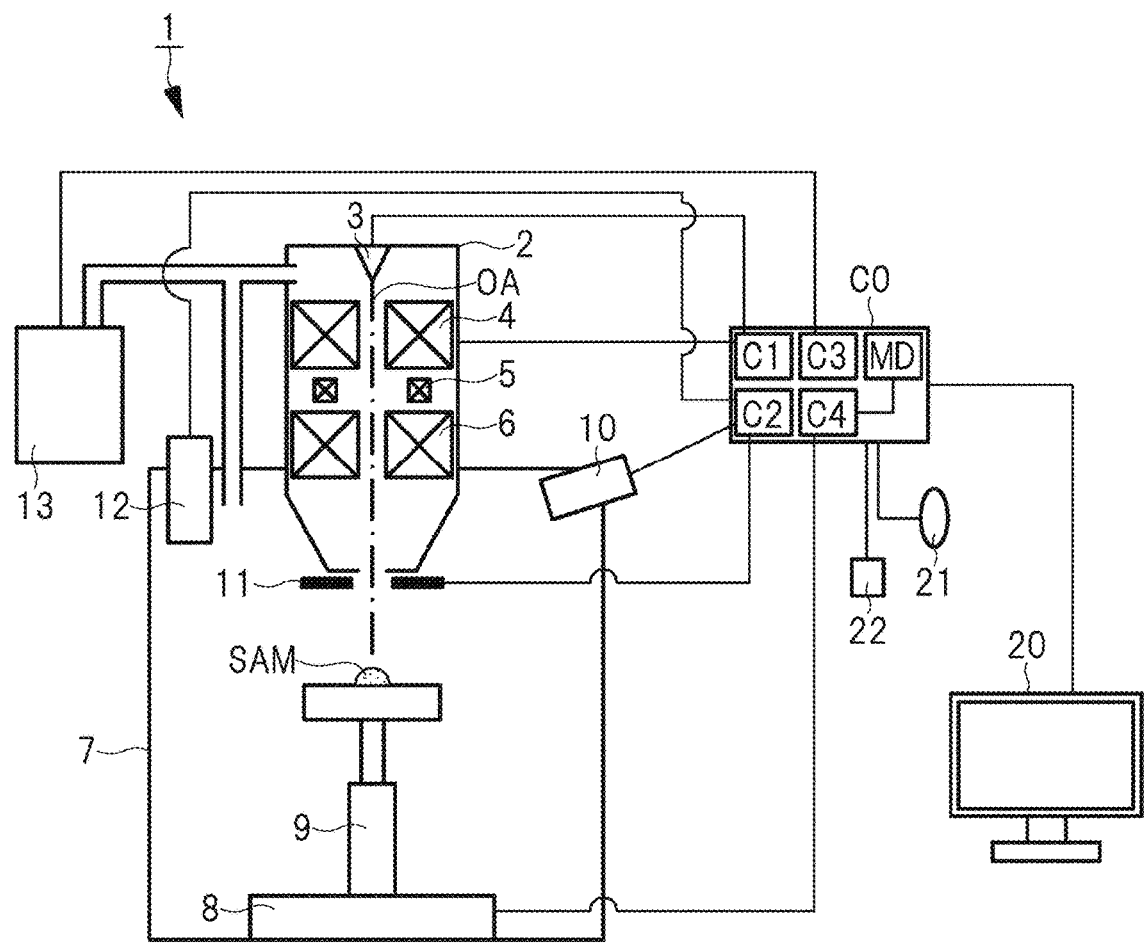

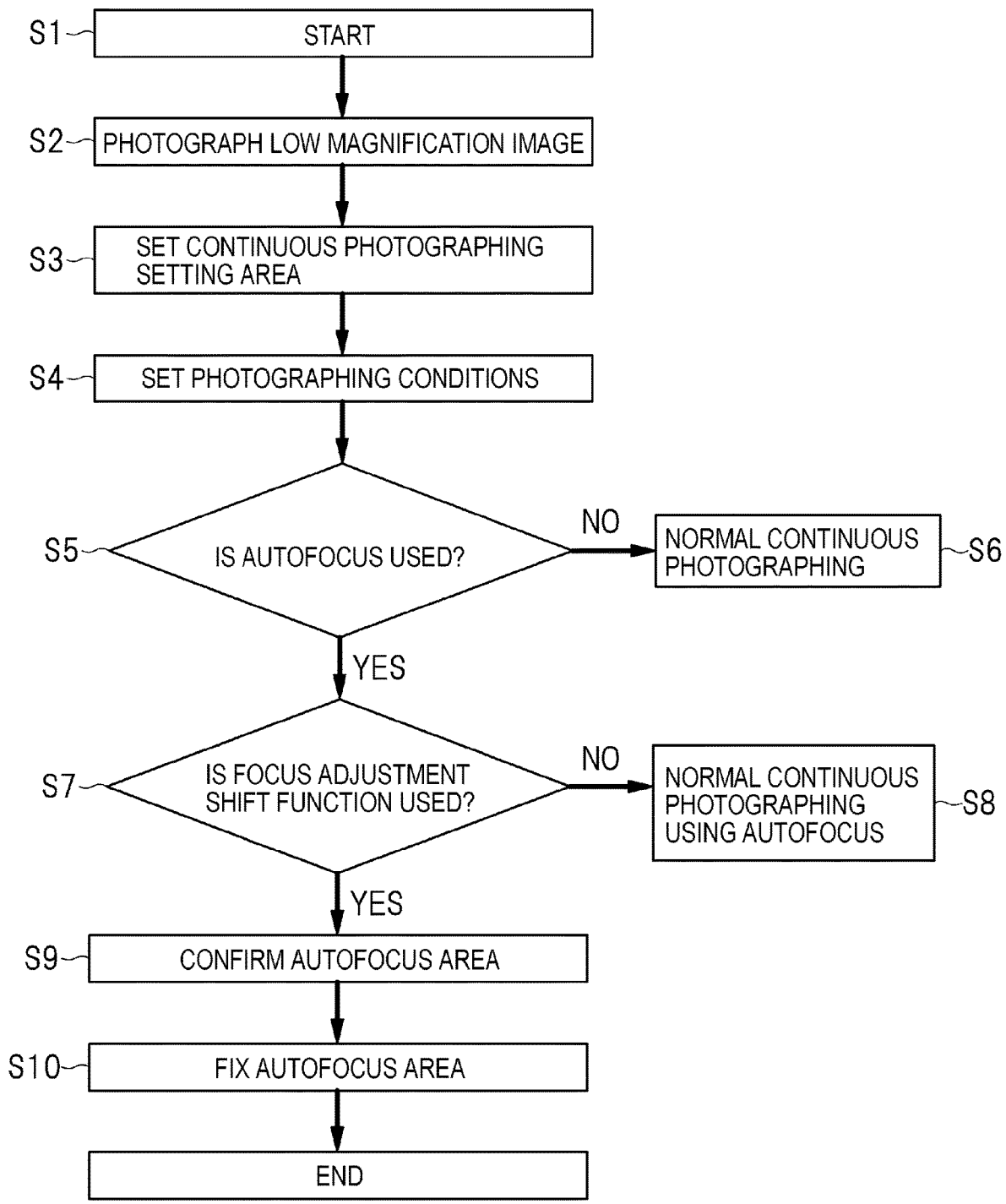

[FIG. 3]
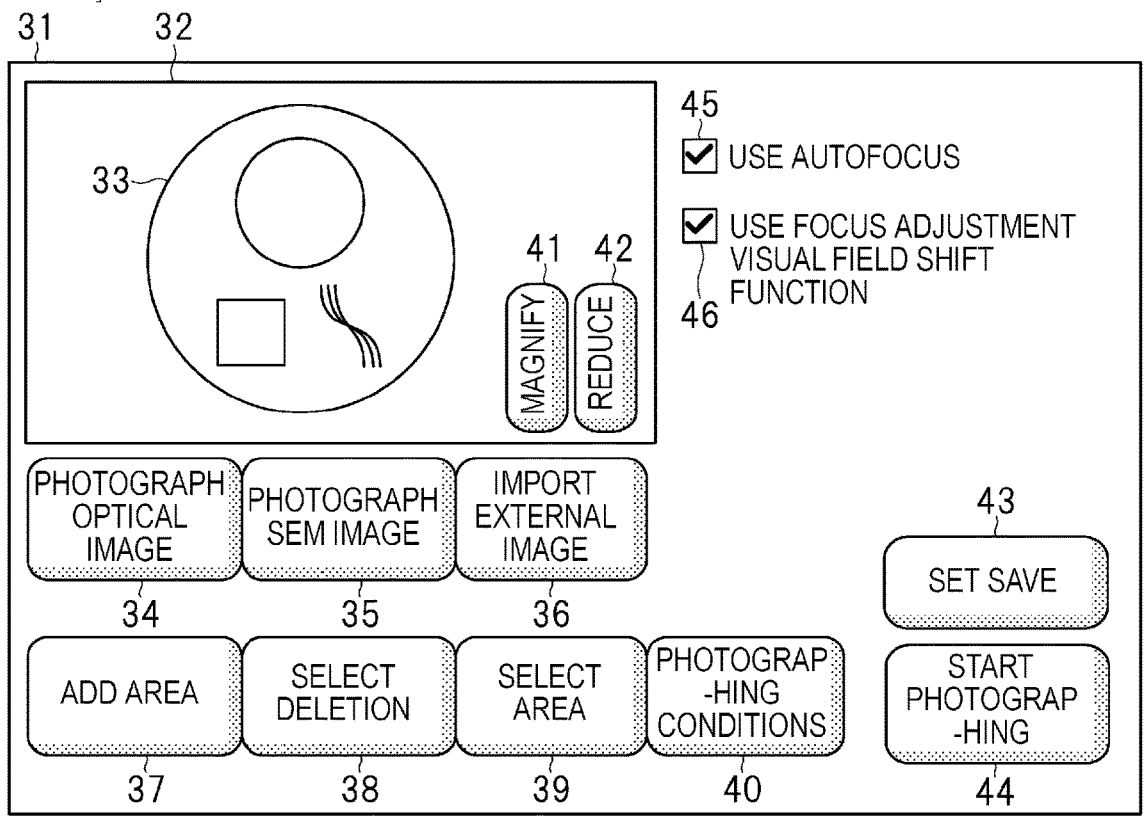
[FIG. 4]
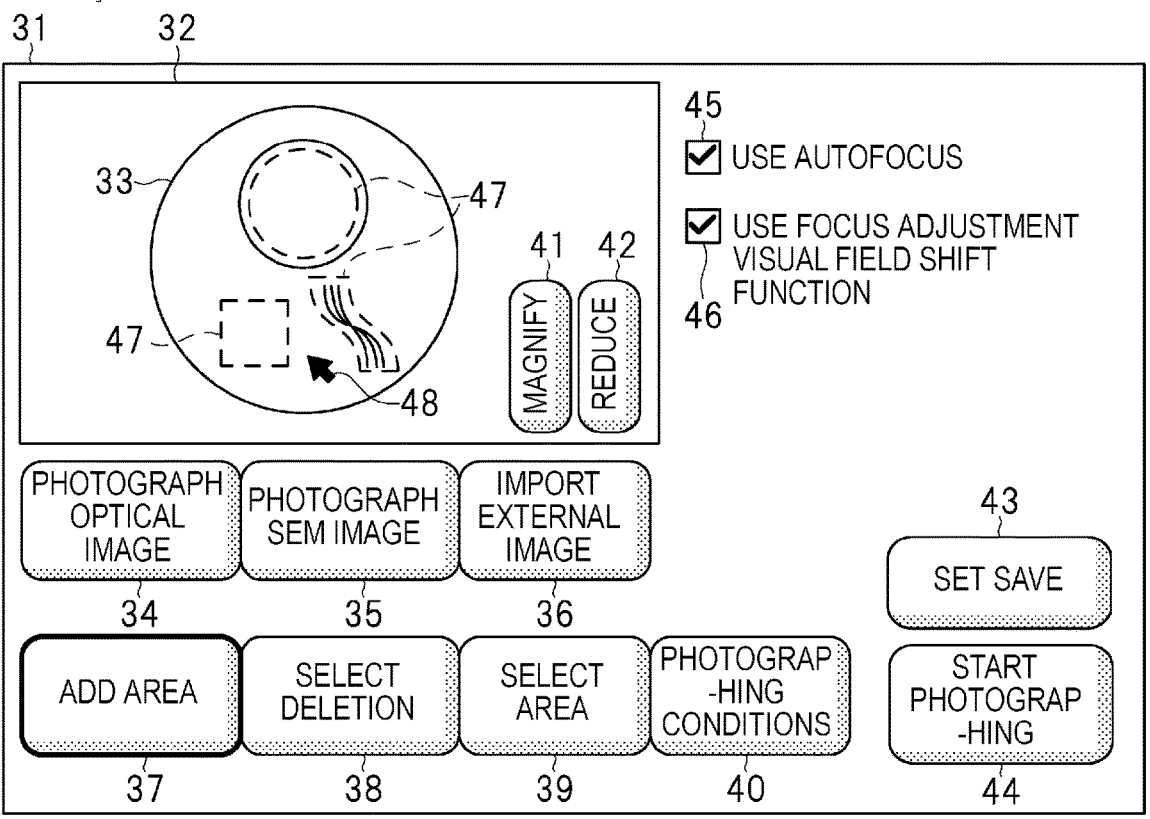

[FIG. 5]
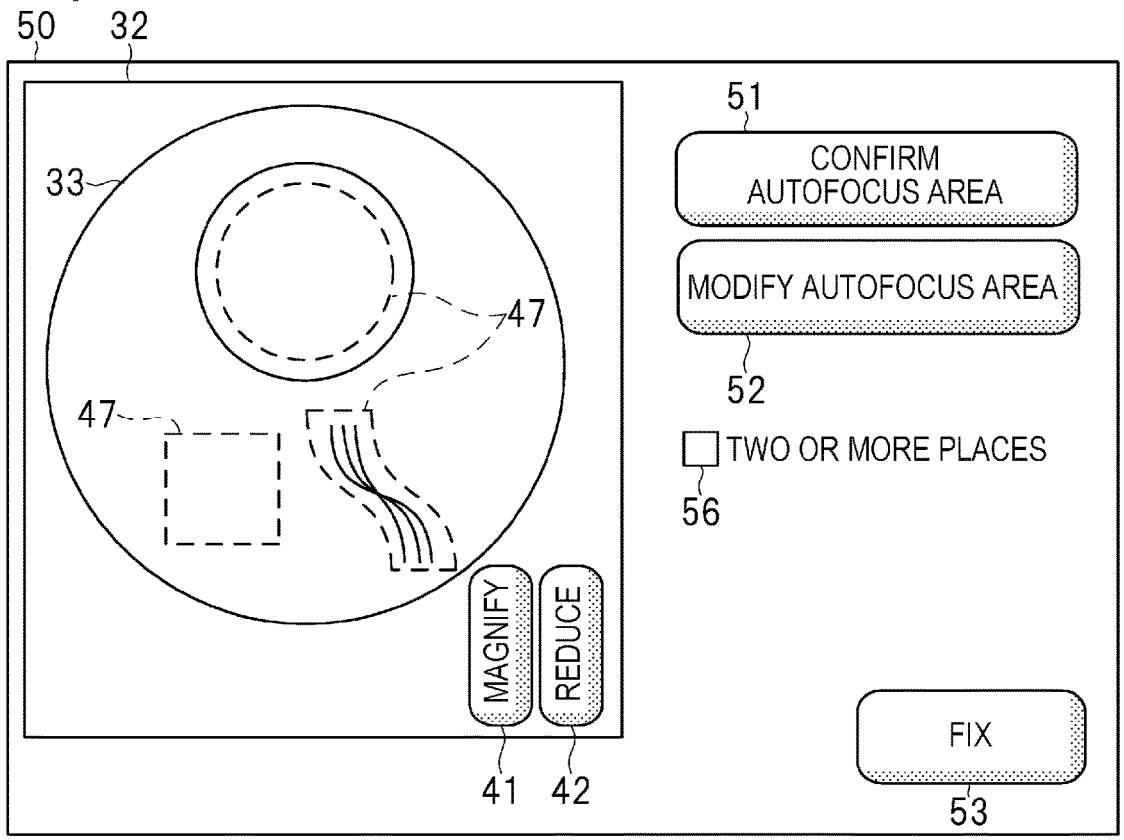
[FIG. 6]
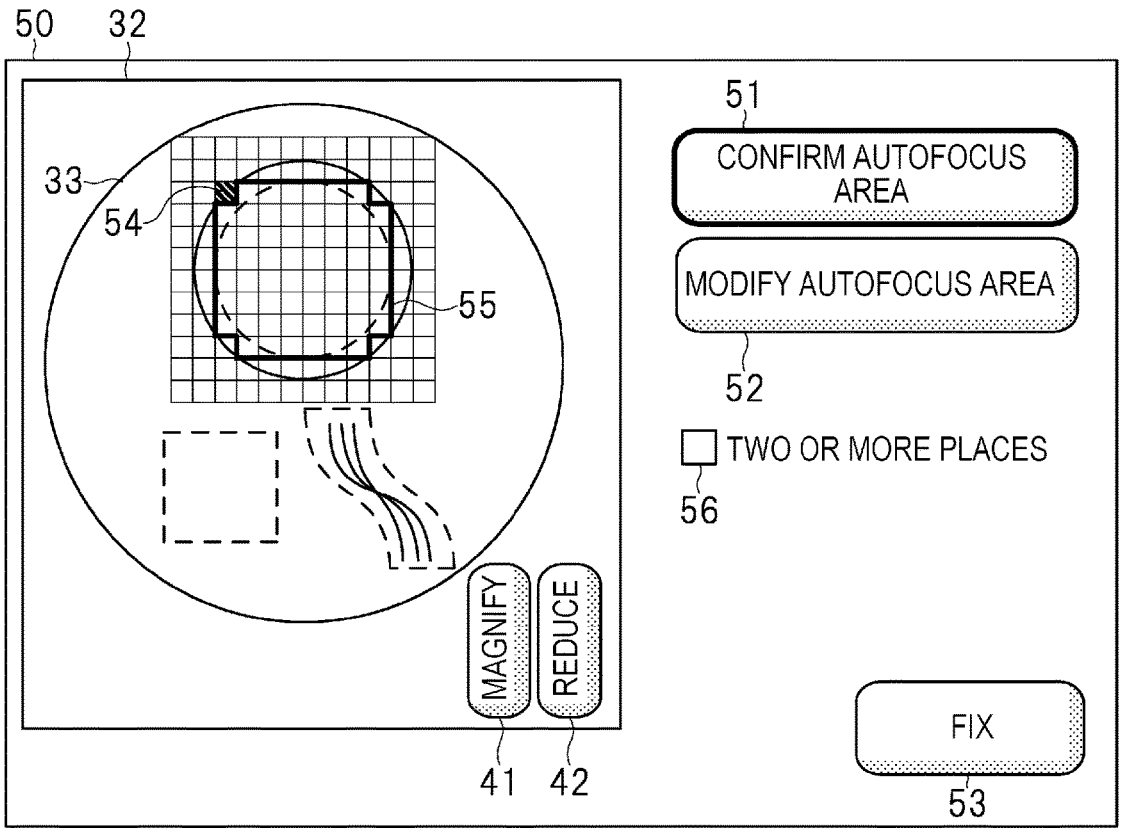

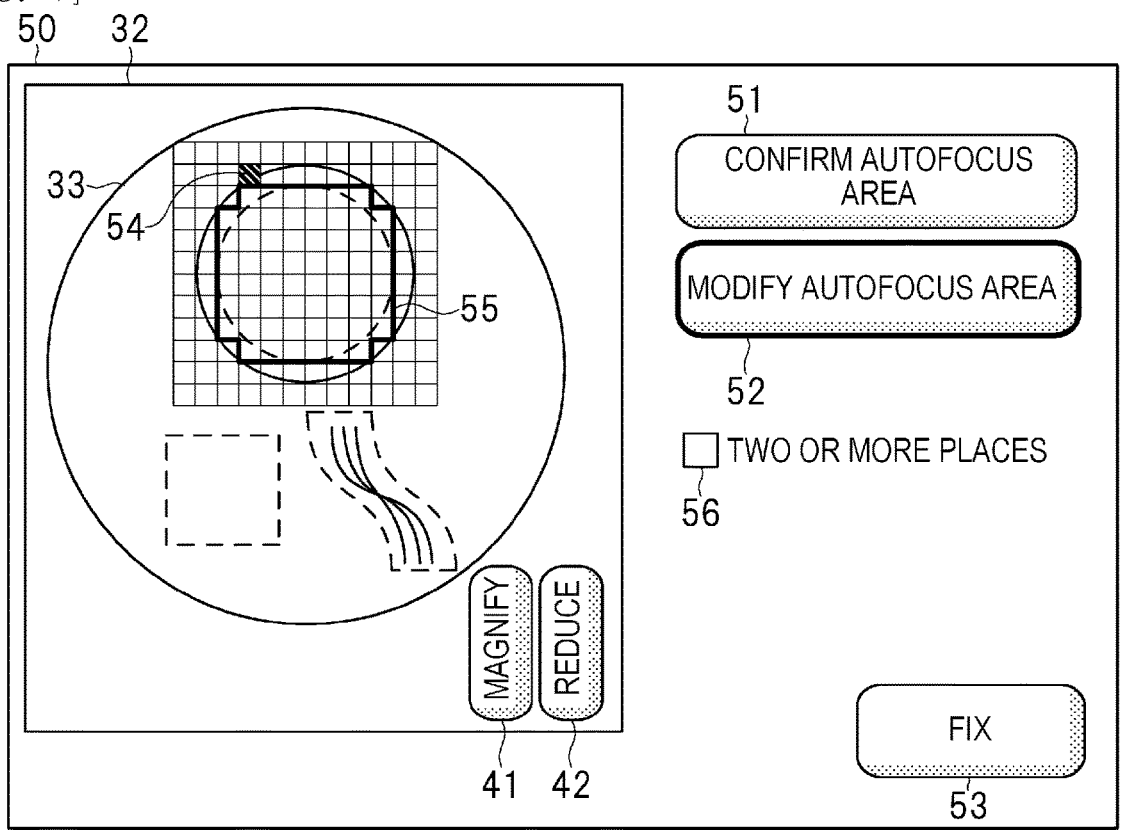
[FIG. 7]
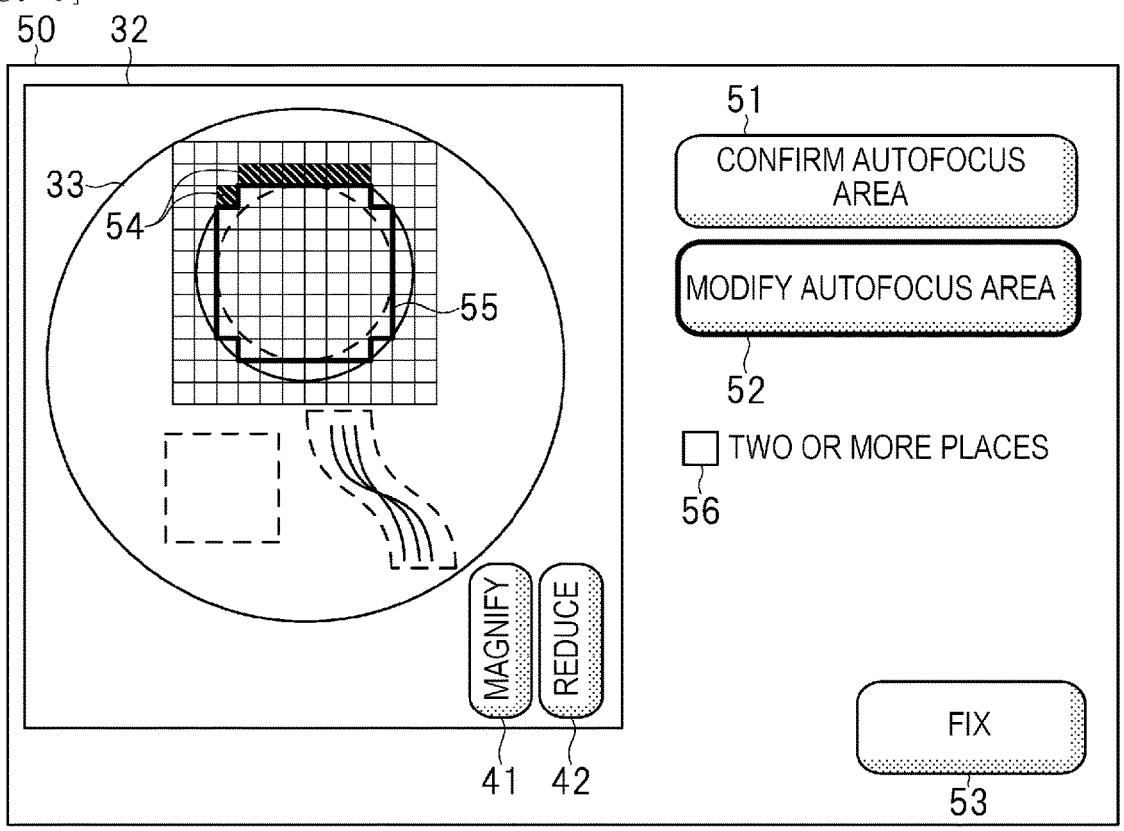
[FIG. 8]

[FIG. 9]
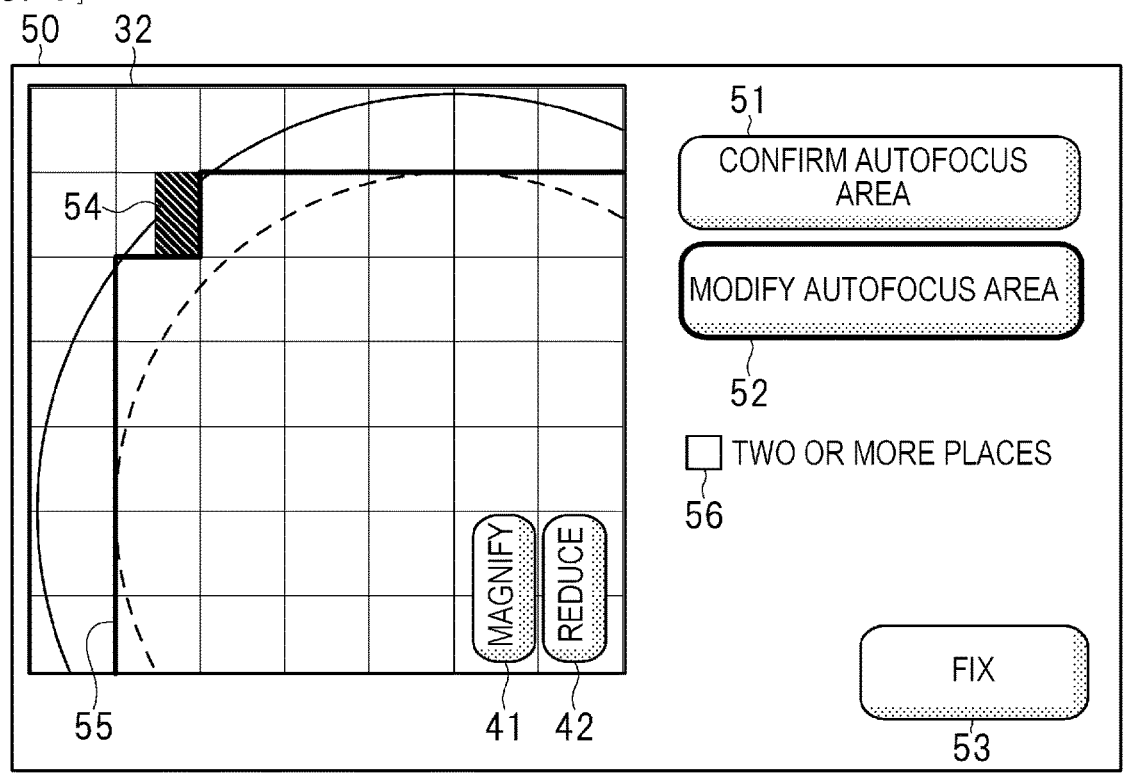
[FIG. 10]
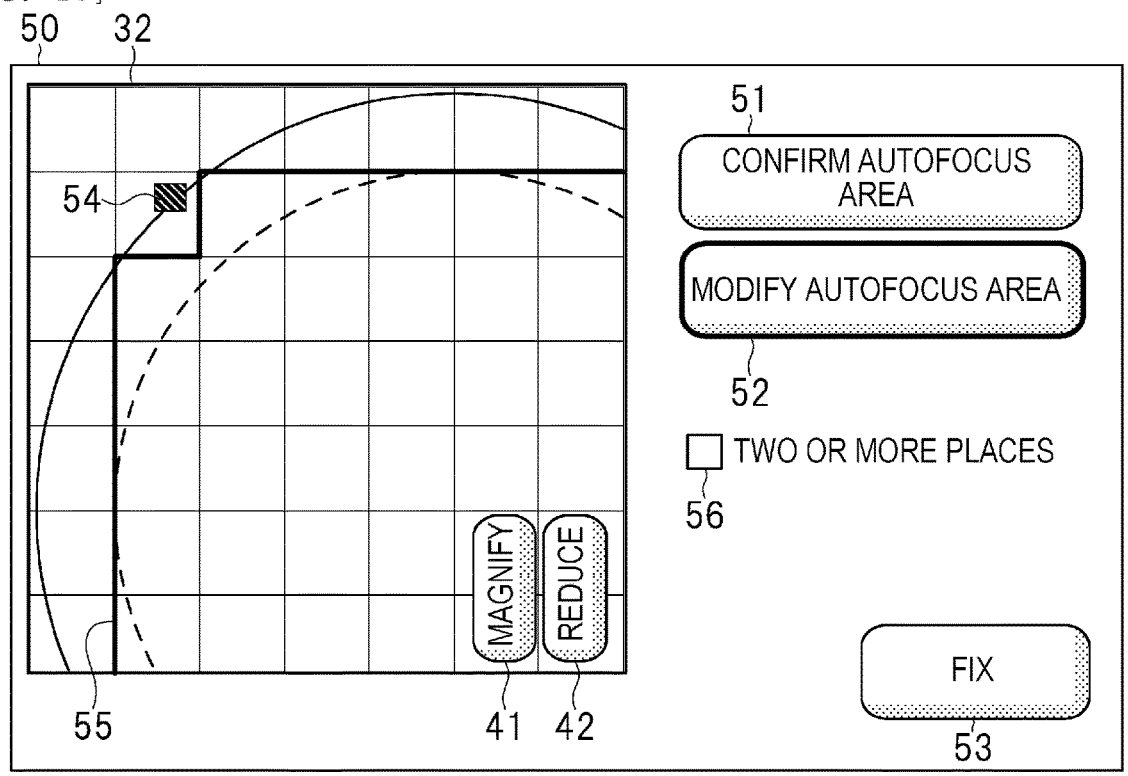

[FIG. 11]
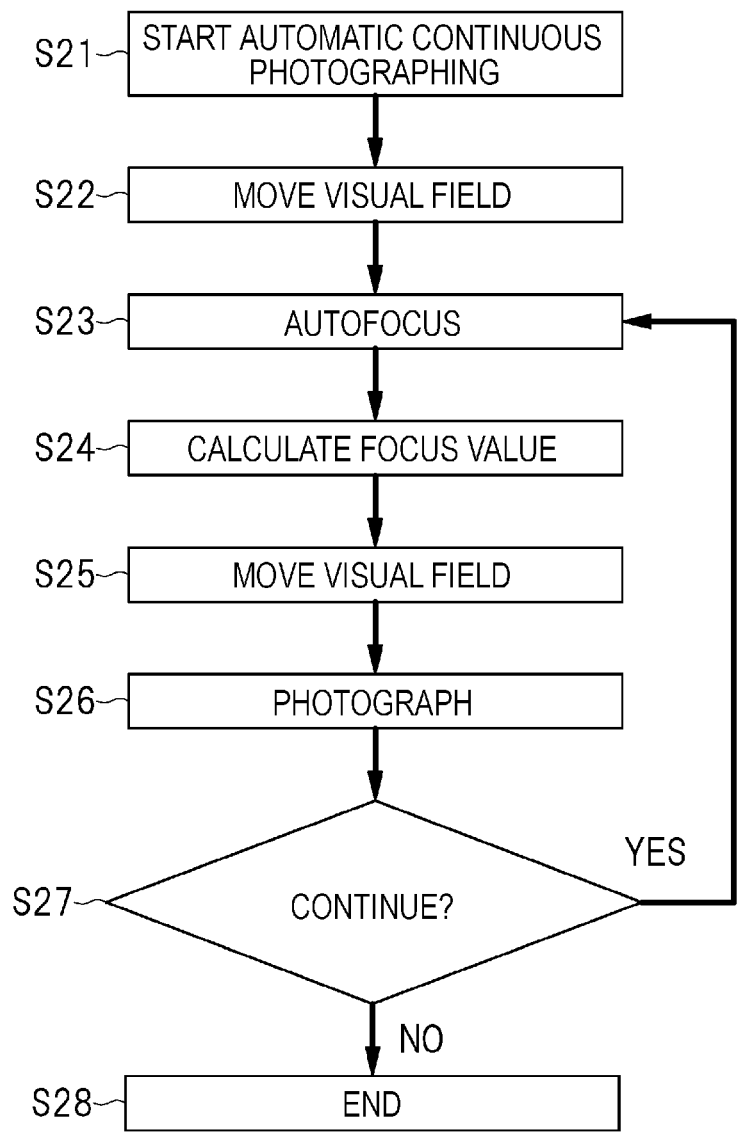

[FIG. 12]
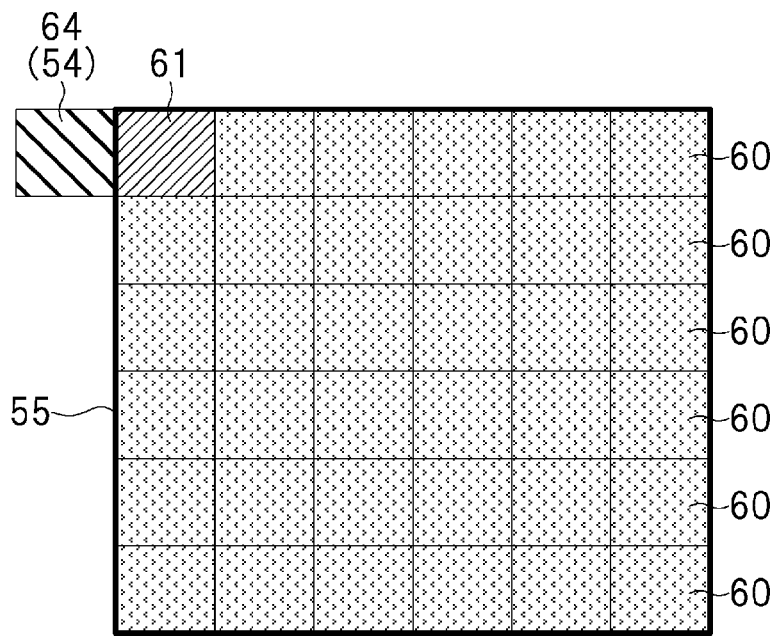
[FIG. 13]
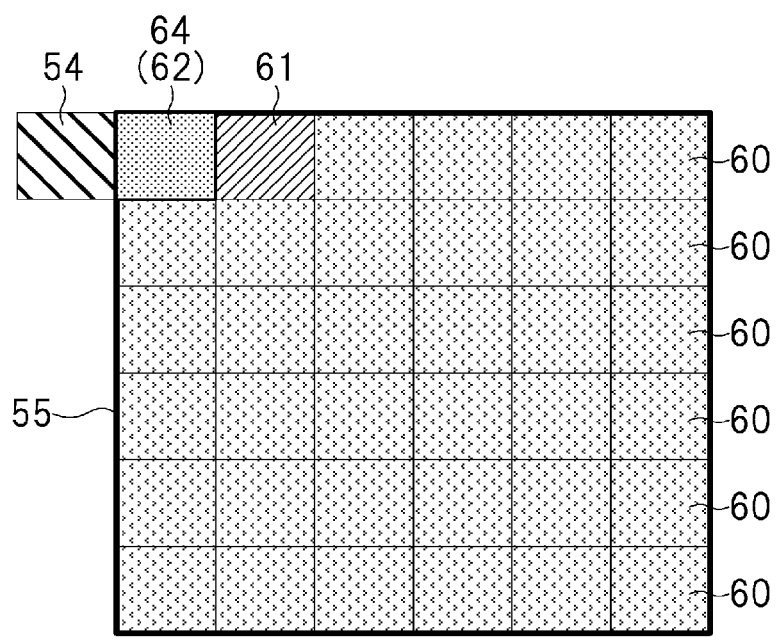

[FIG. 14]
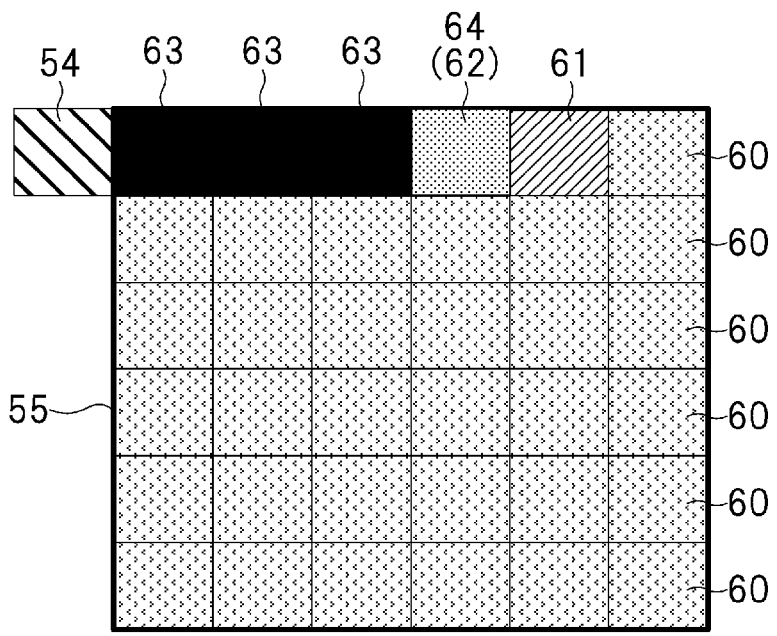
[FIG. 15]
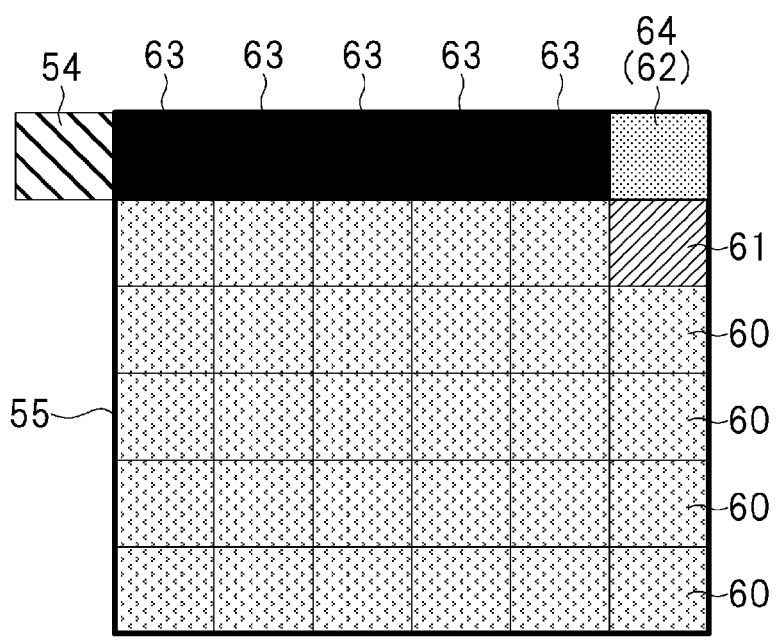

[FIG. 16]
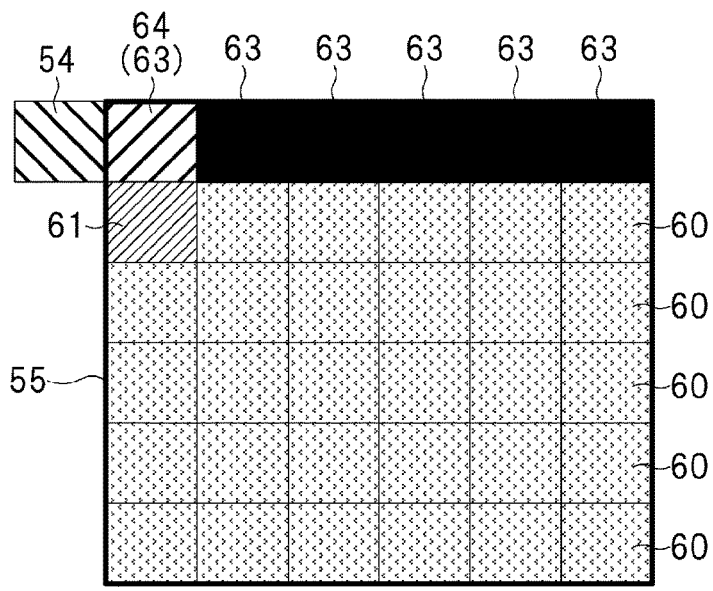
[FIG. 17]
| PHOTOGRAPHED IMAGE NO. | X COORDINATE | Y COORDINATE | R COORDINATE | T COORDINATE | AUTOFOCUS VALUE | FILE SAVE LOCATION |
|---|---|---|---|---|---|---|
| 1 | 12.5 | 15.0 | 0.0 | 0.0 | 5.6 | D:¥abcde¥ab |
| 2 | 13.0 | 15.0 | 0.0 | 0.0 | 5.6 | D:¥abcde¥ab |
| 3 | 13.5 | 15.0 | 0.0 | 0.0 | 5.7 | D:¥abcde¥ab |
| 4 | 14.0 | 15.0 | 0.0 | 0.0 | 5.8 | D:¥abcde¥ab |
| 5 | 14.5 | 15.0 | 0.0 | 0.0 | 5.7 | D:¥abcde¥ab |
| ⋮ | ⋮ | ⋮ | ⋮ | ⋮ | ⋮ | ⋮ |

[FIG. 18]
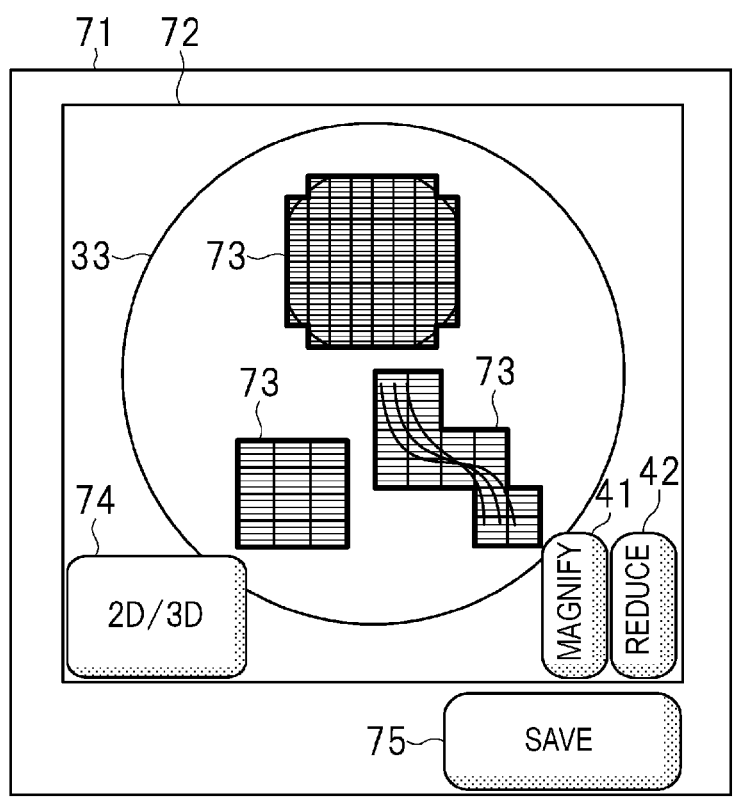
[FIG. 19]
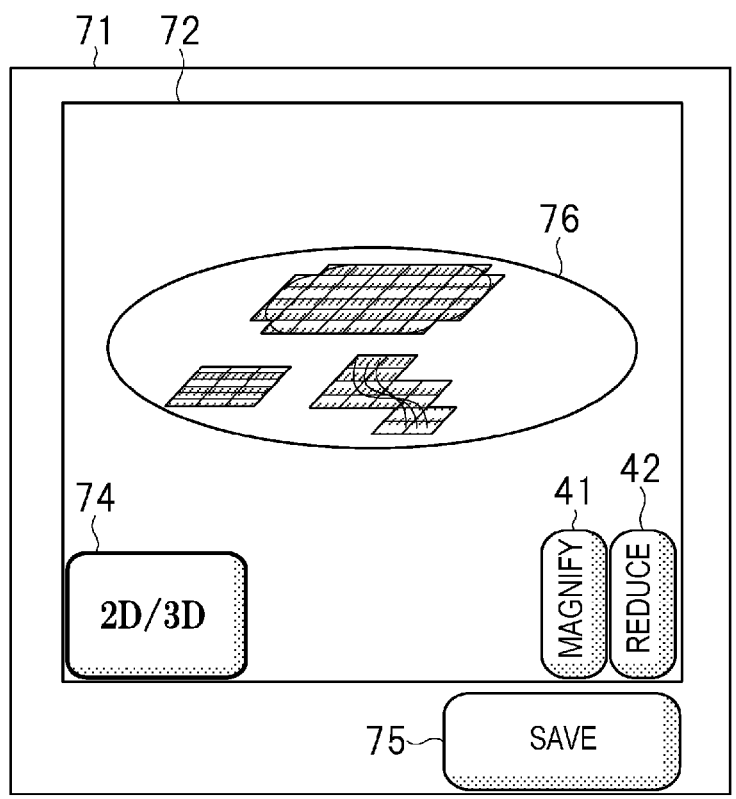

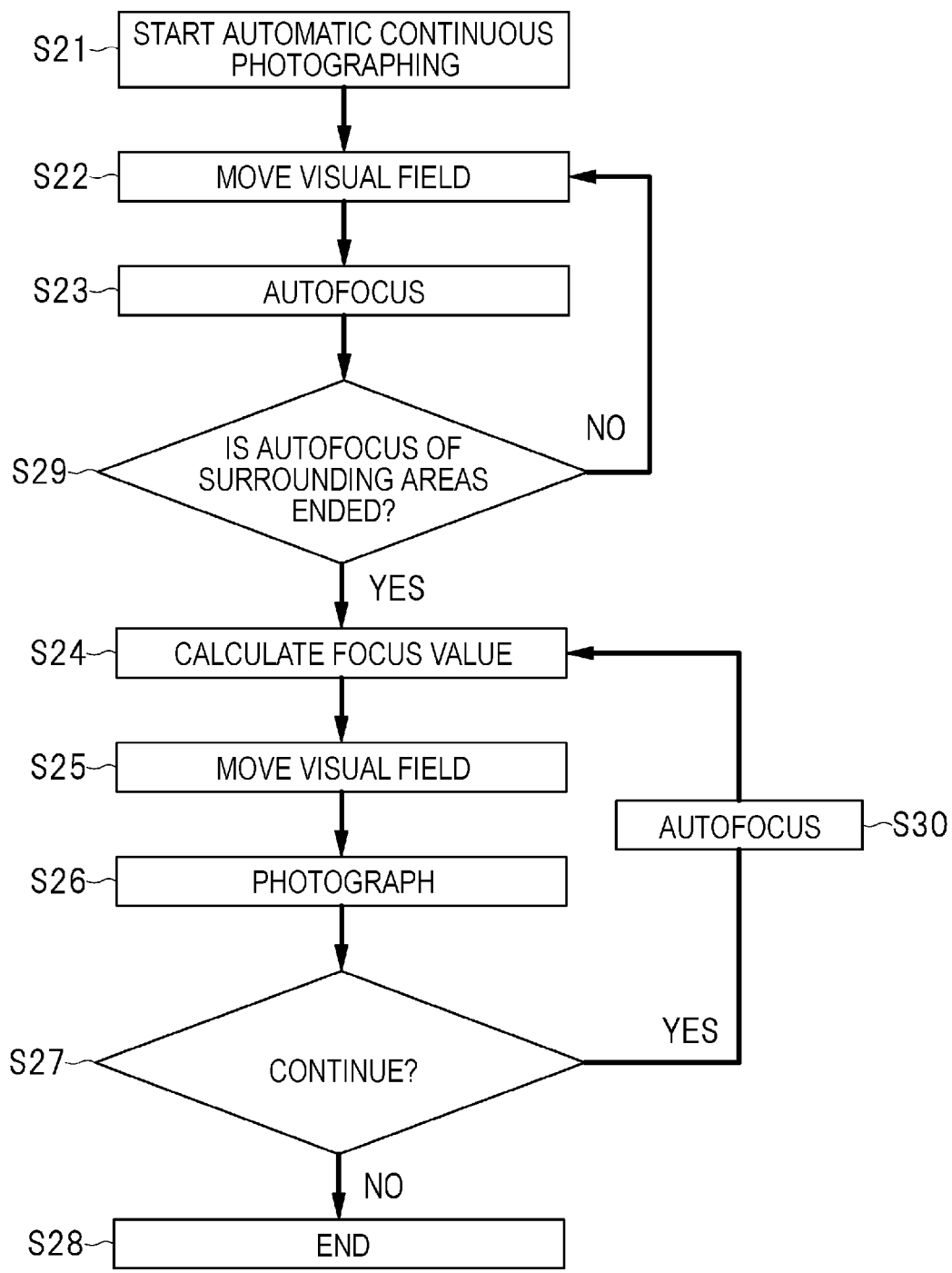

[FIG. 21]
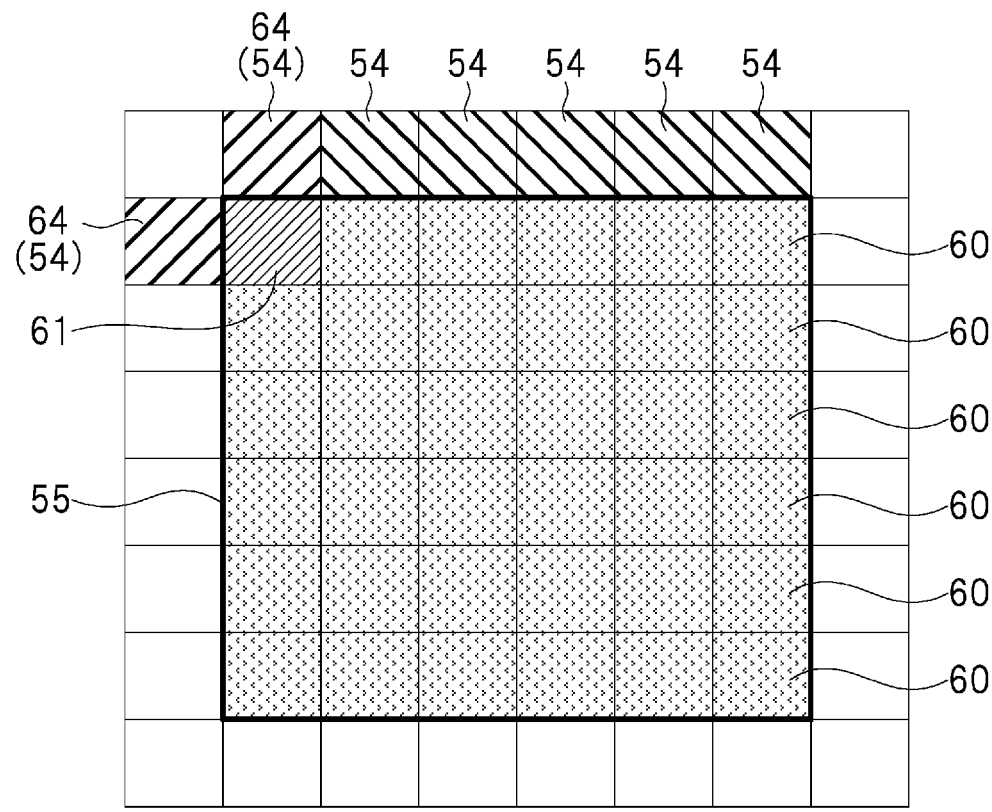
[FIG. 22]
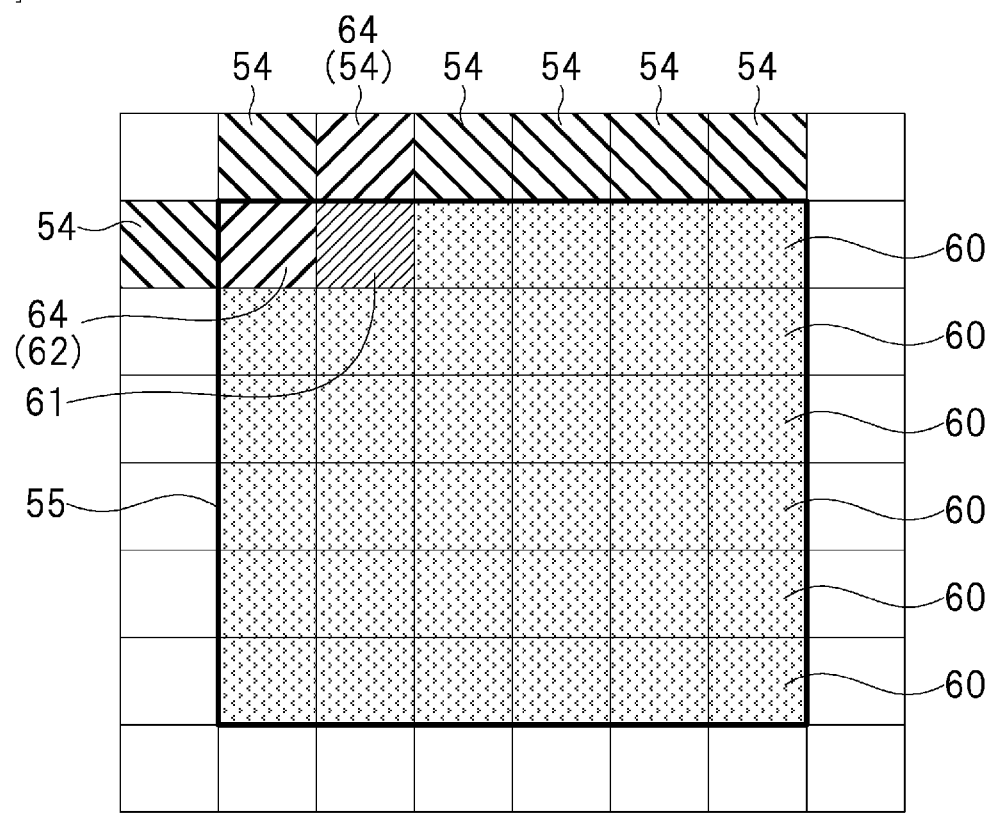

[FIG. 23]
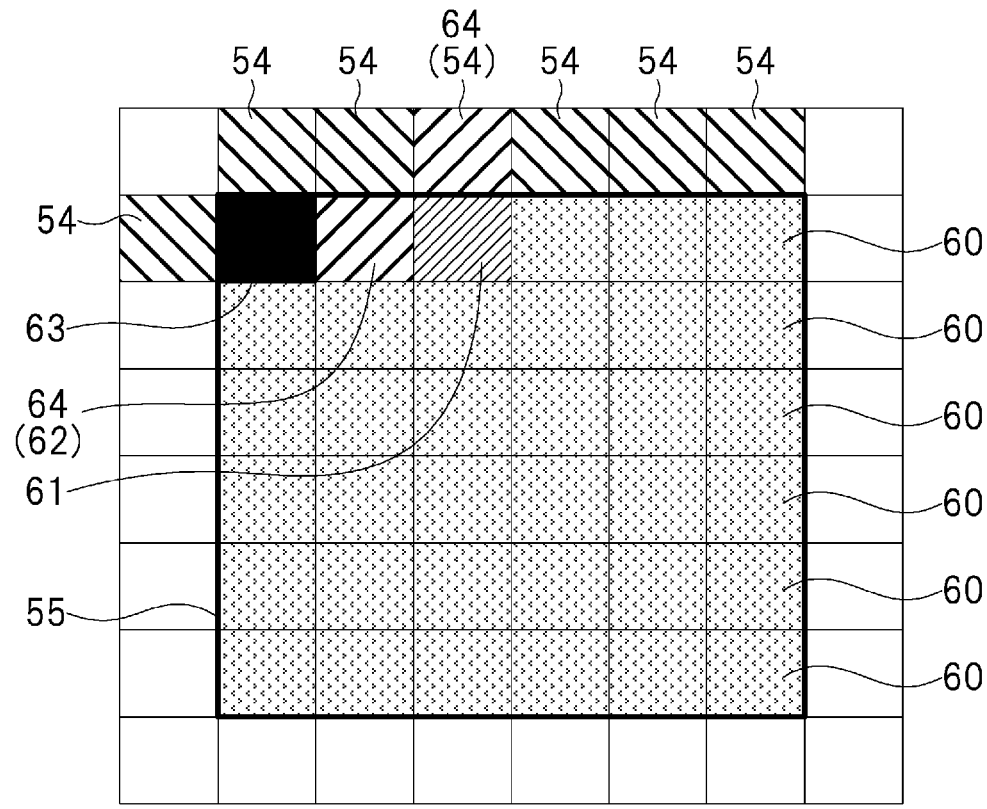
[FIG. 24]
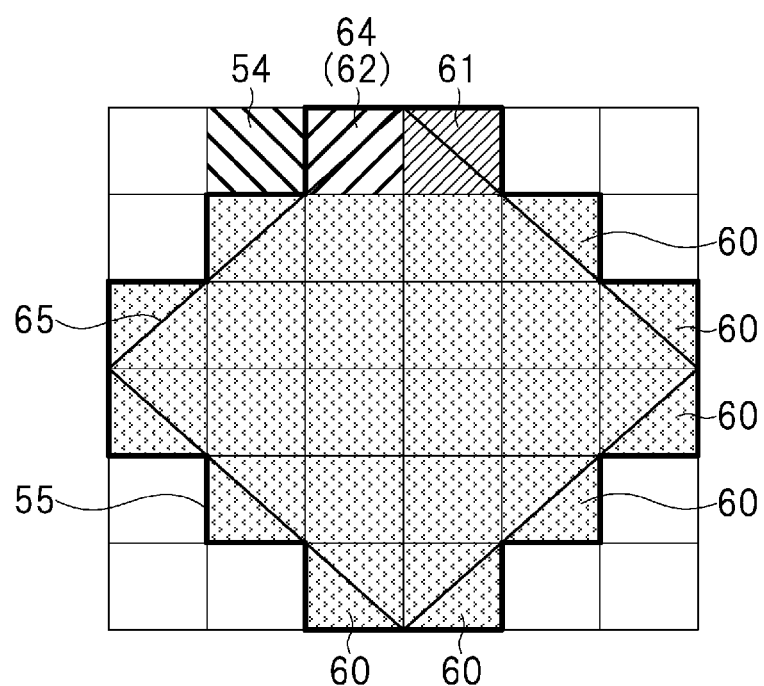

[FIG. 25]
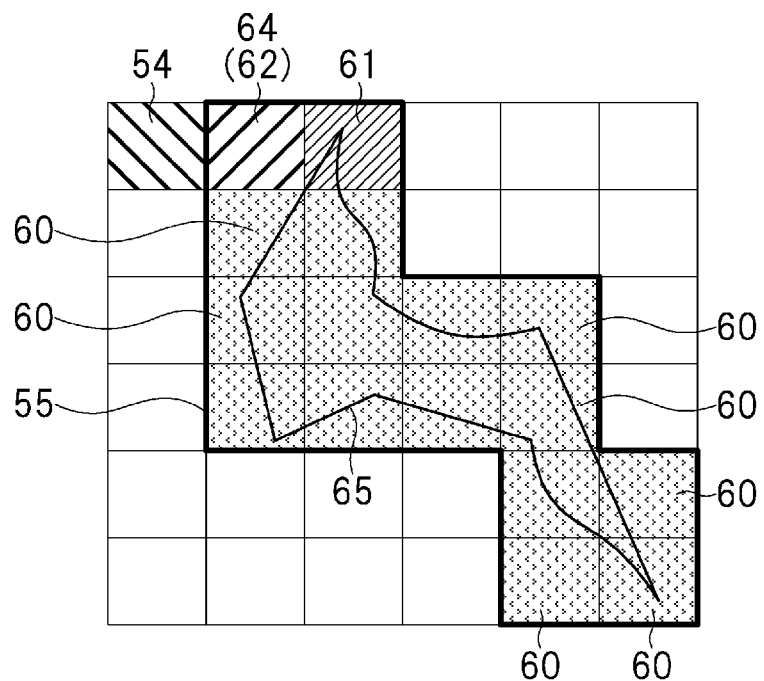
[FIG. 26]
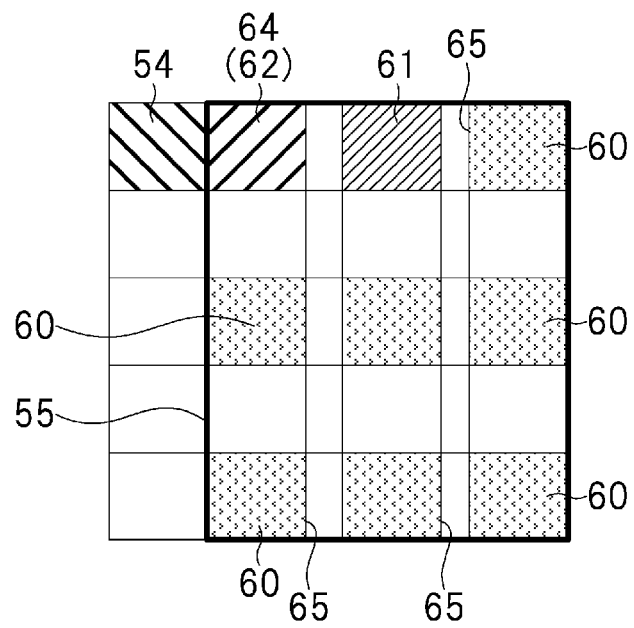

CHARGED PARTICLE BEAM DEVICE

TECHNICAL FIELD

The present invention relates to a charged particle beam device, and can be particularly suitably used for a charged particle beam device having an autofocus function.

BACKGROUND ART

Conventionally, a scanning electron microscope (SEM), which is one type of charged particle beam device, is used to perform high-magnification observation of a continuous visual field over a wide area. However, the high-magnification observation is manually performed by a user in many cases. However, in recent years, in order to shorten the working hours, there is an increasing demand for automatic continuous photographing over a wide area, and various scanning electron microscopes equipped with an automatic continuous photographing function have been developed. Further, when the surface of the sample, which is an observation target, is not horizontal and flat, it is necessary to perform photographing while performing automatic focusing (autofocus) when performing continuous photographing automatically.

For example, JP-A-2010-244740 (PTL 1) and JP-A-2005-201810 (PTL 2) disclose a scanning electron microscope for measuring the length of a semiconductor. Further, a method is disclosed in which, in these scanning electron microscopes, the focal position is automatically set, automatic movement to the focal position is performed every time photographing one photographing visual field, focusing is performed, and then length measuring processing of the photographing visual field is performed.

CITATION LIST

Patent Literature

PTL 1: JP-A-2010-244740
PTL 2: JP-A-2005-201810

SUMMARY OF INVENTION

Technical Problem

However, in PTL 1 and PTL 2, when the photographing visual field is a wide area, it is necessary to automatically move to the focal position every time photographing is performed, which requires a lot of time. Therefore, when photographing a sample by using a charged particle beam device, a technique that can shorten the photographing time as much as possible is desired.

Further, since the surface of the sample may not always be in the same focal position as the focus position, there is a problem that the focus is significantly deviated. In particular, in the case of a sample that is easily charged or a sample that is easily damaged by the beam, a scan mark tends to remain in the visual field during autofocus. Therefore, there is a problem that an accurate photographed image cannot be obtained because a scan mark or beam damage is also photographed in the photographed image. Therefore, a technique for obtaining a more accurate photographed image when photographing a sample using a charged particle beam device is desired.

Other issues and novel features will be apparent from the description and accompanying drawings herein.

Solution to Problem

A brief overview of the representative embodiments disclosed in the present application is as follows.

According to an embodiment, there is provided a charged particle beam device including: an electron gun capable of emitting an electron beam; an objective lens for focusing the electron beam; a stage for installing a sample; a detector capable of detecting secondary electrons or reflection electrons emitted from the sample as a signal when the sample is installed on the stage and the sample is irradiated with the electron beam at the time of analysis of the sample; a control unit electrically connected to the electron gun, the objective lens, the stage, and the detector, and having an image processing control circuit capable of converting the signal detected by the detector into a photographed image; a photographing function for automatically continuously photographing each of a plurality of photographing visual fields in the sample, which are analysis targets, as the photographed image at the time of analysis of the sample; and an autofocus function for automatically focusing each of the plurality of photographing visual fields and automatically calculating focus values thereof at the time of analysis of the sample. Here, each of the plurality of photographing visual fields is focused in a first focus value calculation visual field adjacent to the photographing visual field designated as a photographing target among the plurality of photographing visual fields, and the focus value calculated in the first focus value calculation visual field is used for calculating the focus values of each of the plurality of photographing visual fields.

Advantageous Effects of Invention

According to one embodiment, when the sample is photographed by using the charged particle beam device, the photographing time can be shortened. At that time, a more accurate photographed image can be obtained.

BRIEF DESCRIPTION OF DRAWINGS

FIG. 1 is a schematic diagram showing a charged particle beam device according to Embodiment 1.

FIG. 2 is a flowchart of setting for automatic continuous photographing in Embodiment 1.

FIG. 3 is a selection screen for a focus adjustment visual field shift function according to Embodiment 1.

FIG. 4 is a selection screen when a continuous photographing setting area is added in FIG. 3.

FIG. 5 is a confirmation screen of a focus adjustment visual field in Embodiment 1.

FIG. 6 is a confirmation screen when any area is selected in FIG. 5.

FIG. 7 is a confirmation screen when an autofocus area is modified in FIG. 5.

FIG. 8 is a confirmation screen when the autofocus area is modified in FIG. 5.

FIG. 9 is a confirmation screen when the autofocus area is modified in FIG. 5.

FIG. 10 is a confirmation screen when the autofocus area is modified in FIG. 5.

FIG. 11 is a flowchart of executing the automatic continuous photographing in Embodiment 1.

FIG. 12 is a schematic diagram showing a relationship between a focus adjustment position and a photographing position during wide-area continuous photographing in Embodiment 1.

FIG. 13 is a schematic diagram showing the relationship between the focus adjustment position and the photographing position following FIG. 12.

FIG. 14 is a schematic diagram showing the relationship between the focus adjustment position and the photographing position following FIG. 13.

FIG. 15 is a schematic diagram showing the relationship between the focus adjustment position and the photographing position following FIG. 14.

FIG. 16 is a schematic diagram showing the relationship between the focus adjustment position and the photographing position following FIG. 14.

FIG. 17 is a recording table showing a recording example of each information in Embodiment 1.

FIG. 18 is an output screen after automatic continuous photographing in Embodiment 1.

FIG. 19 is an output screen after automatic continuous photographing in Embodiment 1.

FIG. 20 is a flowchart of executing automatic continuous photographing in Embodiment 2.

FIG. 21 is a schematic diagram showing a relationship between a focus adjustment position and a photographing position during wide-area continuous photographing in Embodiment 2.

FIG. 22 is a schematic diagram showing the relationship between the focus adjustment position and the photographing position following FIG. 21.

FIG. 23 is a schematic diagram showing the relationship between the focus adjustment position and the photographing position following FIG. 22.

FIG. 24 is a schematic diagram showing a modification example of an automatic continuous photographing area.

FIG. 25 is a schematic diagram showing a modification example of the automatic continuous photographing area.

FIG. 26 is a schematic diagram showing a modification example of an automatic continuous photographing area.

DESCRIPTION OF EMBODIMENTS

Hereinafter, embodiments will be described in detail with reference to the drawings. In all the drawings for describing the embodiments, the members having the same function will be given the same reference numerals, and the repeated description thereof will be omitted. Further, in the following embodiments, the same or similar parts will not be repeated in principle unless it is particularly necessary.

Embodiment 1

<Configuration of Charged Particle Beam Device>

A charged particle beam device 1 according to Embodiment 1 will be described below with reference to FIG. 1. In FIG. 1, for example, a scanning electron microscope (SEM) is exemplified as the charged particle beam device 1.

The charged particle beam device 1 shown in FIG. 1 analyzes (observes) a sample SAM by irradiating the sample SAM arranged in a sample chamber 7 with an electron beam from an electron gun 3 provided inside a lens barrel 2.

The charged particle beam device 1 includes the sample chamber 7 and the lens barrel 2 attached to the sample chamber 7 and constituting an electron beam column. The lens barrel 2 includes the electron gun 3 capable of emitting an electron beam (charged particle beam), a condenser lens 4 for focusing the electron beam, a deflection coil 5 for scanning the electron beam, an objective lens 6 for focusing on the surface of the sample SAM, and the like.

Inside the sample chamber 7, a holder 9 for mounting the sample SAM, a stage 8 for installing the holder 9 (sample SAM), a secondary electron detector 10, a reflection electron detector 11, an optical camera 12, and the like are provided. At the time of analysis of the sample SAM, the sample SAM and the holder 9 are transported to the inside of the sample chamber 7, installed on the stage 8, and focused on the intersection with an optical axis OA. In the present application, the holder 9 on which the sample SAM is mounted may be simply described as "sample SAM".

When the sample SAM is irradiated with an electron beam, the secondary electron detector 10 can detect the secondary electrons emitted from the sample SAM as a signal, and when the sample SAM is irradiated with the electron beam, the reflection electron detector 11 can detect the reflection electrons emitted from the sample SAM as a signal. Further, the optical camera 12 can photograph the sample SAM or the optical image (low magnification image, photographed image) of the holder 9 on which the sample SAM is mounted.

Further, although detailed illustration is omitted in FIG. 1, the charged particle beam device 1 includes a plurality of secondary electron detectors 10 and a plurality of reflection electron detectors 11. The plurality of secondary electron detectors 10 and the plurality of reflection electron detectors 11 are provided inside the sample chamber 7 to face the sample SAM from directions different from each other at the time of analysis of the sample SAM. With the plurality of secondary electron detectors 10 and the plurality of reflection electron detectors 11, a three-dimensional SEM image (photographed image) can be acquired.

Further, the secondary electron detector 10 and the reflection electron detector 11 may be provided outside the lens barrel 2 or inside the lens barrel 2. Further, the optical camera 12 does not necessarily have to be mounted on the charged particle beam device 1. In addition, the charged particle beam device 1 may include other lenses, other electrodes, and other detectors.

Outside the sample chamber 7, the charged particle beam device 1 includes a vacuum pump 13 and an integrated control unit C0. The integrated control unit C0 is electrically or physically connected to a scanning signal control unit C1, a vacuum control unit C3, a signal control unit C2, a stage control unit C4, and a storage medium MD, and controls these units. In the present application, it may be described that the control performed by each of the control units C1 to C4 is performed by the integrated control unit C0. Further, the integrated control unit C0 including each of the control units C1 to C4 and the storage medium MD may be regarded as one control unit, and the integrated control unit C0 may be simply referred to as a "control unit".

The scanning signal control unit C1 is electrically connected to the electron gun 3, the condenser lens 4, the deflection coil 5, and the objective lens 6 to control the operations thereof. The electron gun 3 receives a control signal from the scanning signal control unit C1 to generate an electron beam, and the electron beam is irradiated toward the sample SAM.

Each of the condenser lens 4, the deflection coil 5, and the objective lens 6 receives a control signal from the scanning signal control unit C1 to excite a magnetic field. The magnetic field of the condenser lens 4 focuses the electron beam to have an appropriate beam diameter. The magnetic field of the deflection coil 5 deflects and scans the electron beam two-dimensionally on the sample SAM. The magnetic field of the objective lens 6 focuses the electron beam again onto the sample SAM. Further, by adjusting the excitation intensity of the objective lens 6, the sample SAM can also be focused.

The signal control unit C2 is electrically connected to the secondary electron detector 10, the reflection electron detector 11, and the optical camera 12, and controls the operations thereof. Further, the signal control unit C2 includes an image processing control circuit capable of processing the signals detected by these and converting each signal into a photographed image (image data). The photographed image is output to a monitor 20. For example, the photographed image includes a low magnification image 33 and an SEM image described later.

The vacuum control unit C3 is electrically connected to the vacuum pump 13 and controls the operation of the vacuum pump 13. When the sample SAM is analyzed in the charged particle beam device 1, the insides of each of the lens barrel 2 and the sample chamber 7 are evacuated by the vacuum pump 13. Further, the charged particle beam device 1 may have a configuration in which the inside of the sample chamber 7 can be adjusted to a low vacuum by using an atmosphere inlet or a needle valve.

The stage control unit C4 is electrically connected to the stage 8 and has a function of controlling the operation of the stage 8 and always linking the visual field and the coordinates of the stage 8. The storage medium MD can save information such as each visual field, the coordinates of the stage 8, and the acquired photographed image (image data), and each piece of information is associated with each other.

The stage 8 includes an XY-axis drive mechanism that can be driven in a direction parallel to the placement surface of the charged particle beam device 1, a Z-axis drive mechanism that can be driven in a direction (height direction) perpendicular to the placement surface, an R-axis drive mechanism that can be driven in the rotational direction, and a T-axis drive mechanism that can be driven in an inclined direction that is inclined with respect to the XY plane. Each of these drive mechanisms is a mechanism used for analyzing any part of the sample SAM and the holder 9 installed on the stage 8. As a result, a part in the sample SAM, which is an analysis target, can be moved to the center of the photographing visual field.

The charged particle beam device 1 includes the monitor 20, a mouse 21, and a trackball 22 electrically connected to the integrated control unit C0 outside or inside the charged particle beam device 1. When the user works on the monitor 20 using the mouse 21 or the trackball 22, various information is input to the integrated control unit C0 or output from the integrated control unit C0. Further, when the user manually operates the stage 8, the user can also perform the work by using the mouse 21 or the trackball 22.

The charged particle beam device 1 according to Embodiment 1 has a photographing function for automatically continuously photographing each of a plurality of photographing visual fields in the sample SAM, which are analysis targets, as a photographed image at the time of analysis of the sample SAM, and an autofocus function for automatically focusing each of the plurality of photographing visual fields and automatically calculating the focus values thereof.

Hereinafter, the photographing function and the autofocus function in Embodiment 1 will be described with reference to these setting methods and operation methods.

<Setting of Automatic Continuous Photographing>

The setting of automatic continuous photographing in Embodiment 1 will be described below with reference to FIGS. 2 to 10. In the following, description will be given while comparing each of the steps S1 to S10 shown in the flowchart of FIG. 2 with FIGS. 3 to 10.

First, in step S1, the holder 9 on which the sample SAM is mounted is transported to the inside of the sample chamber 7 and installed on the stage 8. Then, the integrated control unit C0 adjusts each drive mechanism of the stage 8 such that a part in the sample SAM, which is an analysis target, is positioned at the center of the visual field. After that, the analysis of the sample SAM is started.

In step S2, the low magnification image (photographed image) 33 is photographed. First, as shown in FIG. 3, the integrated control unit C0 outputs a selection screen 31 of the focus adjustment visual field shift function onto the monitor 20, and outputs a low magnification image display unit 32, buttons 34 to 44, and check boxes 45 and 46 to the selection screen 31.

The low magnification image display unit 32 is provided to display the low magnification image 33 of the sample SAM, the button 34 is provided to photograph an optical image, the button 35 is provided to photograph an SEM image, and the button 36 is provided to output the image data of the low magnification image 33 photographed outside the charged particle beam device 1. Further, the magnifying button 41 is provided to magnify and display the low magnification image 33, and the reducing button 42 is provided to reduce and display the low magnification image 33.

The area adding button 37, the area deleting button 38, the area selecting button 39, and the photographing conditions button 40 are buttons related to the setting of a continuous photographing setting area 47 of the sample SAM, the photographing conditions, and the like, which will be described later. Further, the save setting button 43 is provided to store the above settings, the above photographing conditions and the like in the storage medium MD, and the photographing start button 44 is provided to complete the above setting and start photographing in the photographing visual field.

Further, the check box 45 is provided to set whether or not the autofocus function is used, and the check box 46 is to set whether or not the focus adjustment visual field shift function is used, that is, to set an AF shift area 54 described later.

When the user clicks the optical image photographing button 34 or the SEM image photographing button 35, the low magnification image 33 is photographed. When the user clicks the button 34, the optical camera 12 photographs the holder 9 including the sample SAM or a part of the sample SAM. When the user clicks the button 35, an electron beam is emitted from the electron gun 3 to the sample SAM, and the secondary electron detector 10 or the reflection electron detector 11 photographs the holder 9 including the sample SAM or a part of the sample SAM. These can also be superimposed on the optical camera image. The low magnification image 33 photographed by these is displayed on the low magnification image display unit 32.

Instead of the button 34 and the button 35, when the user clicks the external image import button 36, the low magnification image 33 photographed outside the charged particle beam device 1 can also be displayed on the low magnification image display unit 32. An external image can also be pasted on the low magnification image 33 acquired by the buttons 34 and 35. When the charged particle beam device 1 in Embodiment 1 does not include the optical camera 12, the low magnification image 33 of the sample SAM is photographed by another device provided with the optical camera 12, and the photographed data can be displayed on the low magnification image display unit 32.

In step S3, the continuous photographing setting area 47 is set. First, as shown in FIG. 4, when the user clicks the area adding button 37, the area to be automatically continuously photographed over a wide area is set, and the continuous photographing setting area 47 is displayed on the low magnification image 33. Next, when the plurality of continuous photographing setting areas 47 exist, one or a plurality of continuous photographing setting areas 47 can be set by using an area setting cursor 48.

Further, at the time of the work of step S3, the low magnification image 33 can be magnified or reduced by using the magnifying button 41 or the reducing button 42. Further, by clicking the area deleting button 38, the set continuous photographing setting area 47 can also be deleted.

In step S4, photographing conditions are set. First, the user clicks the area selecting button 39 and selects any continuous photographing setting area 47. Next, when the user clicks the photographing conditions button 40, various photographing conditions such as the magnification, the acceleration voltage, the margin amount between the visual fields, the signal to be used, the scanning speed, and the save name can be set for the selected continuous photographing setting area 47.

In step S5, whether or not to use the autofocus function is set. When using the autofocus function in each photographing visual field (YES), the user checks the check box 45. In this case, the next process is step S7.

When the check box 45 is not checked (NO), the next process is step S6, and normal continuous photographing is performed. Normal continuous photographing is a method of acquiring an SEM image of a photographing area group without performing focusing before and after photographing.

In step S7, whether or not to use the focus adjustment visual field shift function is set. When the focus adjustment visual field shift function is performed (YES), the user checks the check box 46. Further, the focus adjustment shift function will be described later. Next, the user clicks the save setting button 43 and sets the save destination of the photographed image. Next, the user clicks the photographing start button 44. In this case, the next process is step S9.

When the check box 46 is not checked (NO), the next process is step S8, continuous photographing using autofocus is performed in each visual field, and an SEM image of the photographing area group is acquired.

In step S9, the autofocus area is confirmed. First, when the user clicks the button 44 while the check boxes 45 and 46 are checked, as shown in FIG. 5, the integrated control unit C0 outputs a confirmation screen 50 of the focus adjustment visual field onto the monitor 20, and outputs the low magnification image display unit 32 on which the low magnification image 33 and the continuous photographing setting area 47 are displayed, the magnifying button 41, the reducing button 42, a confirmation button 51, a modification button 52, a fix button 53, and a check box 56 to the confirmation screen 50.

The confirmation button 51 is provided to confirm the autofocus area, and is provided to confirm the plurality of photographing visual fields (automatic continuous photographing area 55) and the AF shift area 54, as will be described later. The modification button 52 is provided to modify the autofocus area, and is provided to modify the AF shift area 54. The fix button 53 is provided to fix the autofocus area.

Further, as will be described in detail in Embodiment 2 described later, the check box 56 is provided to perform focusing in two or more focus value calculation visual fields 64 (AF shift area 54 or the like) for one photographing visual field.

The user selects any continuous photographing setting area 47 for the continuous photographing setting area 47 set in step S3, and confirms the autofocus shift area (AF shift area) 54. As shown in FIG. 6, when the user clicks the confirmation button 51, the automatic continuous photographing area 55 (plurality of photographing visual fields) arranged to include a part of the continuous photographing setting area 47 and the AF shift area 54 arranged outside the continuous photographing setting area 47 is displayed on the low magnification image display unit 32.

As will be described later, the automatic continuous photographing area 55 is an area composed of a plurality of photographing visual fields, but at least a part thereof includes the continuous photographing setting area 47 in each of the plurality of photographing visual fields. On the contrary, the AF shift area 54 is an area that does not include the continuous photographing setting area 47.

Further, the integrated control unit C0 automatically determines the automatic continuous photographing area 55 and the AF shift area 54 for the continuous photographing setting area 47. The automatic continuous photographing area 55 is determined based on the magnification set in step S4, the margin amount between the photographing visual fields, and the like.

Further, when the user clicks the modification button 52, the position, number, and shape of the AF shift area 54 can be modified.

For example, as shown in FIG. 7, the position of the AF shift area 54 can be changed with respect to FIG. 6, and as illustrated in FIG. 8, the number of AF shift areas 54 can be changed (increased or decreased) with respect to FIG. 6. Further, as shown in FIGS. 9 and 10, when the user clicks the magnifying button 41, the user can change the shape of the AF shift area 54 in any manner after the low magnification image 33 is magnified and displayed.

When there is an uneven place such as a hole in the area designated as the AF shift area 54, an error may occur in the focus value. Therefore, by modifying the AF shift area 54, a highly accurate focus value can be obtained.

In step S10, the autofocus area is fixed. By clicking the fix button 53, the setting of the automatic continuous photographing area 55 and the AF shift area 54 is ended.

As will be described in detail later, the AF shift area 54 is a visual field for adjusting the focus before performing automatic continuous photographing, and is an area in which actual photographing is not performed. The AF shift area 54 is automatically set near the automatic continuous photographing area 55, but as described above, the user can appropriately modify the AF shift area 54 on the low magnification image 33 of the confirmation screen 50. Therefore, for example, it is possible to prevent a problem that the AF shift area 54 automatically set by the integrated control unit C0 deviates significantly from the first focus value in the automatic continuous photographing area 55.

<Execution of Automatic Continuous Photographing>

The execution of automatic continuous photographing in Embodiment 1 will be described below with reference to steps S21 to S28 shown in FIG. 11. Further, the automatic continuous photographing uses the autofocus function and the photographing function provided in the charged particle beam device 1, and is automatically performed by the integrated control unit C0 including each of the control units C1 to C4. Further, in steps S21 to S28, the AF shift area 54 is used as an example of the focus value calculation visual field 64, which will be described later, for calculating the focus value by autofocus.

First, in step S21, automatic continuous photographing is started following step S10. Next, in step S22, the visual field is moved. By moving the stage 8 by the stage control unit C4, the designated AF shift area 54 is arranged directly under the objective lens 6.

Next, in step S23, the scanning signal control unit C1 executes autofocus of the AF shift area 54. At this time, the entire visual field is autofocused. As shown in FIG. 9 or 10, when the user sets the AF shift area 54 to any size, autofocusing is performed at the same position in each visual field. Further, regarding the search range of the focus value, when the movement of the stage 8 in the X direction and the Y direction is large, the search range of the focus value becomes large. Further, when the movement of the stage 8 in the X direction and the Y direction is small, the search range of the focus value becomes small. Therefore, the time required for focus adjustment is shortened, and the throughput is improved.

Next, in step S24, the focus value of the AF shift area 54 is calculated.

Next, in step S25, the stage 8 is moved by the stage control unit C4, and accordingly, the first visual field of the automatic continuous photographing area 55 is arranged directly under the objective lens 6. That is, the designated visual field 61, which will be described later, designated as the photographing target is arranged directly under the objective lens 6.

Next, in step S26, the designated visual field 61 is automatically photographed using the focus value calculated in step S24.

Next, in step S27, it is determined whether or not to continue photographing in another photographing visual field. When the photographing is continued (YES), the next process is step S23, and when the photographing is not continued (NO), the next process is step S28, and the automatic continuous photographing is ended.

Further, the coordinates, focus value, file save location, and the like of the stage 8 that has undergone autofocus are saved in the storage medium MD by the integrated control unit C0. Further, the photographed image obtained by photographing and the coordinates of the stage 8 where the photographing was performed are also saved in the storage medium MD by the integrated control unit C0. For example, as shown in FIG. 17, these pieces of information can also be saved in the storage medium MD as a recording table 70.

Hereinafter, the relationship between the focus adjustment position and the photographing position during wide-area continuous photographing in Embodiment 1 will be described with reference to FIGS. 12 to 16.

The automatic continuous photographing area 55 includes a plurality of photographing visual fields in the sample SAM, which are analysis targets. The plurality of photographing visual fields correspond to the areas indicated by reference numerals 60 to 63, but for convenience of description, in the following description, the plurality of photographing visual fields 60 to 63 are described as the scheduled visual field 60 which is scheduled to be photographed, the designated visual field 61 which is designated as a photographing target, the adjustment visual field 62 that has been photographed and has not been autofocused, and the completed visual field 63 that has been photographed and has been autofocused.

Further, the AF shift area 54 is an area which is not included in the automatic continuous photographing area 55, and is an area in the sample SAM, which is not an analysis target.

Further, each of the plurality of photographing visual fields 60 to 63 is focused in the focus value calculation visual field 64, but the AF shift area 54, the adjustment visual field 62, and the completed visual field 63 are used as the focus value calculation visual fields 64 depending on the situation.

First, as shown in FIG. 12, when the first designated visual field 61 in the automatic continuous photographing area 55 is photographed, the focusing is performed in the focus value calculation visual field 64 adjacent to the designated visual field 61, and the focus value calculated in the focus value calculation visual field 64 is used for calculating the focus value. Further, in FIG. 12, the focus value calculation visual field 64 is the AF shift area 54. After that, the stage 8 moves such that the designated visual field 61 is arranged directly under the objective lens 6, and the first designated visual field 61 is photographed.

Next, as shown in FIG. 13, when the second designated visual field 61 is photographed, the focusing is performed in the adjustment visual field 62 that has already been photographed as the focus value calculation visual field 64, and the focus value calculated in the adjustment visual field 62 is used for calculating the focus value. After that, the stage 8 is moved such that the second designated visual field 61 is arranged directly under the objective lens 6, and the second designated visual field 61 is photographed.

FIG. 14 shows a state where photographing of the plurality of designated visual fields 61 is completed. The photographing visual field that has been photographed and has been autofocused is the completed visual field 63.

As shown in FIG. 15, after photographing the photographing visual field (adjustment visual field 62) positioned at the end portion of the automatic continuous photographing area 55, the stage 8 is moved in the up-down direction, the scheduled visual field 60 adjacent to the adjustment visual field 62 in the up-down direction is designated to as the designated visual field 61. After that, the stage 8 is moved in the left-right direction, and each scheduled visual field 60 in the second row is photographed. That is, continuous photographing of a plurality of photographing visual fields is performed as if writing with a single stroke.

Further, instead of the continuous photographing with one stroke, as shown in FIG. 16, when the photographing of the plurality of photographing visual fields in the first row is completed, the stage 8 may be moved in the up-down direction of the completed visual field 63. When performing the movement as shown in FIG. 16, the completed visual field 63 is set as the focus value calculation visual field 64, and the information of the completed visual field 63 saved in the storage medium MD is used. That is, by using the coordinates of the stage 8 and the already calculated focus value, it is possible to photograph the designated visual field 61.

Further, in Embodiment 1, the upper left photographing visual field is set as the first designated visual field 61, but the photographing visual field to be photographed first can be set in any manner. In addition, the photographing order can also be set in any manner.

Further, when the focus value is deviated and the autofocus fails, high-speed autofocus may be performed at a low magnification such that no beam mark remains, the completed visual field 63 (focus value calculation visual field 64) may be focused again at the place where contrast is formed, and the designated visual field 61 may be photographed.

Further, when the sample SAM is made of a soft material, when the sample SAM is photographed, the photographing visual field may be recessed due to beam damage. In that case, the amount of recess may be calculated in advance before wide-area photographing after scanning, and the focus value in consideration of the amount of recess may be calculated.

Further, when the plurality of automatic continuous photographing areas 55 having the same shape are arranged side by side and the focus value of one visual field in the automatic continuous photographing area 55 is larger or smaller than the focus value of another visual field, it is also possible to link any first photographing visual field in the automatic continuous photographing area 55 and the same second visual field in the automatic continuous photographing area 55 and change the focus value relatively.

As described above, in the automatic continuous photographing in Embodiment 1, in the autofocusing performed before the photographing of the designated visual field 61, the AF shift area 54, which is not an analysis target, the adjustment visual field 62 that has already been photographed, and the completed visual field 63 that has already been photographed, are used as the focus value calculation visual field 64. Therefore, the problem that a scan mark or beam damage remains in the designated visual field 61 at the time of autofocus is solved. Therefore, it is possible to acquire a photographed image such that the scan mark or beam damage is not reflected. That is, a more accurate photographed image can be obtained by the technique disclosed in Embodiment 1.

Further, in the automatic continuous photographing in Embodiment 1, the next designated visual field 61 is autofocused using the adjustment visual field 62 that has already been photographed. Therefore, it is not necessary to move the stage 8 from the start of photographing to the end of autofocus. Further, when the next designated visual field 61 is autofocused using the completed visual field 63, the information of the completed visual field 63 which is already saved in the storage medium MD is used. That is, according to the technique disclosed in Embodiment 1, the photographing time can be shortened as much as possible.

<Creation of Stitched Image and Topography Image>

As shown in FIG. 18, after the photographing each photographing visual field in the automatic continuous photographing area 55 is ended, the integrated control unit C0 outputs an output screen 71 for the wide-area continuous photographing onto the monitor 20, and outputs a stitched image display unit 72 for displaying the stitched image (photographed image) 73, a 2D/3D switching button 74, a save button 75 for saving the stitched image 73, the magnifying button 41, and the reducing button 42 to the output screen 71.

The stitched image display unit 72 can display the low magnification image 33, and each SEM image (photographed image) for which automatic continuous photographing has been completed can be pasted on the low magnification image 33. The stitched image 73 is created by stitching each SEM image (photographed image) based on the coordinates of the stage 8 corresponding to the focus values obtained by the focus of each of the plurality of photographing visual fields, for example, by using the recording table 70 of FIG. 17. Further, the user can also magnify or reduce the stitched image 73 for confirmation by using the magnifying button 41 or the reducing button 42.

As shown in FIG. 19, when the user clicks the 2D/3D switching button 74, the topography image 76 in which each SEM image is stitched is output to the stitched image display unit 72. Each time the user clicks the 2D/3D switching button 74, the stitched image 73 and the topography image 76 are switched. With the topography image 76, the user can grasp the overall unevenness of the sample SAM.

Further, when the user clicks and drags the topography image 76 in the up-down direction using the mouse 21 on the stitched image display unit 72, the unevenness can be magnified or reduced at any magnification. Further, when the user clicks and drags the topography image 76 in the left-right direction, the shape of the topography image 76 as seen from any angle can be confirmed.

Embodiment 2

The charged particle beam device 1 according to Embodiment 2 will be described below with reference to FIGS. 20 to 23. Further, in the following, the differences from Embodiment 1 will be mainly described.

In Embodiment 1, the designated visual field 61 is focused by using one focus value calculation visual field 64. In Embodiment 2, the designated visual field 61 is focused by using two or more focus value calculation visual fields 64. Therefore, each operation described below is performed with a check inserted in the check box 56 shown in FIGS. 5 to 10.

FIG. 20 is a flowchart of executing the automatic continuous photographing in Embodiment 2.

In steps S21 to S23, the same work as in Embodiment 1 is performed, but in Embodiment 2, the plurality of AF shift areas 54 are set around the automatic continuous photographing area 55. The setting of the plurality of AF shift areas 54 is as described with reference to FIG. 8.

Therefore, in step S29, when the focus of all of the AF shift areas 54 fixed in step S10 is not ended (NO), steps S22 and S23 are repeated. When the focus of all of the AF shift areas 54 is ended (YES), the next process is step S24.

In steps S24 to S28, the same work as in Embodiment 1 is performed, but when photographing is continued in step S27 (YES), the process proceeds to step S30 and autofocusing is performed. When the photographing is not continued (NO) in step S27, the next process is step S28, and the automatic continuous photographing is ended.

Hereinafter, the relationship between the focus adjustment position and the photographing position during wide-area continuous photographing in Embodiment 2 will be described with reference to FIGS. 21 to 23.

First, as shown in FIG. 21, when the first designated visual field 61 in the automatic continuous photographing area 55 is photographed, the focusing is performed in two adjacent focus value calculation visual fields 64 at positions different from each other in the designated visual field 61, and focus values calculated in two focus value calculation visual fields 64 are used for calculating the focus value. Further, in FIG. 12, two focus value calculation visual fields 64 are two AF shift areas 54. After that, the stage 8 moves such that the designated visual field 61 is arranged directly under the objective lens 6, and the first designated visual field 61 is photographed.

Further, the focus value of the designated visual field 61 can be calculated, for example, by linearly interpolating the focus values calculated in two focus value calculation visual fields 64.

Next, as shown in FIG. 22, when the second designated visual field 61 is photographed, the adjustment visual field 62 which has already been photographed and the AF shift area 54 adjacent to the second designated visual field 61 are two focus value calculation visual fields 64. Therefore, the second designated visual field 61 is focused in two focus value calculation visual fields 64, and focus values calculated in two focus value calculation visual fields 64 are used for calculating the focus value. After that, the stage 8 is moved such that the second designated visual field 61 is arranged directly under the objective lens 6, and the second designated visual field 61 is photographed.

After that, as shown in FIG. 23, the photographing visual field that has already been photographed and has already been autofocused becomes the completed visual field 63, and the third designated visual field 61 is focused in the second focus value calculation visual field 64.

Further, although not shown here, as the automatic continuous photographing progresses, the adjustment visual field 62 and the completed visual field 63 may be used as two focus value calculation visual fields 64, and the AF shift area 54 and the completed visual field 63 may be used as two focus value calculation visual fields 64.

As described above, in Embodiment 2, the focus value is calculated by using the two focus value calculation visual fields 64 for one designated visual field 61, and thus more highly accurate focus value of the designated visual field 61 is obtained. That is, a more accurate photographed image than that of Embodiment 1 can be obtained by the technique disclosed in Embodiment 2.

Further, in Embodiment 2, as compared with Embodiment 1, the time required for calculating the focus value is increased by the amount of using two focus value calculation visual fields 64. Therefore, it is effective to use the technique disclosed in Embodiment 1 when priority is given to shortening the photographing time, or when the accuracy required for the photographed image may be slightly low. On the contrary, when a more accurate photographed image is required, it is effective to use the technique disclosed in Embodiment 2.

In addition, three or more focus value calculation visual fields 64 may be used for the focus of the designated visual field 61. In that case, as a candidate for three or more focus value calculation visual fields 64, considering that it is preferable that the distance from the designated visual field 61 be short, eight photographing visual fields positioned around the designated visual field 61 can be mentioned. That is, the photographing visual fields positioned on the top, bottom, left, and right of the designated visual field 61 and the photographing visual fields diagonally upper right, diagonally upper left, diagonally lower right, and diagonally lower left of the designated visual field 61 are candidates for three or more focus value calculation visual fields 64.

As described above, by using two or more focus value calculation visual fields 64 for one designated visual field 61, the focus value is calculated, and thus a more accurate photographed image can be obtained. Further, the above-described linear interpolation can also be used for calculating the focus value of the designated visual field 61 in this case.

Modification Example

FIGS. 24 to 26 are schematic views showing a modification example of the automatic continuous photographing area 55 used in Embodiments 1 and 2.

A place in the sample SAM, which is an analysis target, may have various shapes, for example, as an outer shape 65 shown in FIGS. 24 and 25, and may have a gap between the plurality of photographing visual fields as an outer shape 65 shown in FIG. 26. However, even with the outer shape 65, the techniques disclosed in Embodiments 1 and 2 can be applied.

Although the present invention has been specifically described above based on the above-described embodiments, the present invention is not limited to the above-described embodiments and can be variously modified without departing from the gist thereof.

For example, in the above embodiments, the autofocus adjustment is exemplified as an example of the automatic continuous photographing function, but instead of the autofocus adjustment, even when the automatic continuous photographing function is autostigma adjustment, autobrightness adjustment, or autocontrast adjustment, the technique disclosed in the above embodiment can be applied.

Further, in the above embodiments, the number of users who perform various operations on the monitor 20 is not limited to one, and various operations of the plurality of users may be divided. Further, a part or all of the operations performed by the user can also be performed by the artificial intelligence provided in the integrated control unit C0. That is, the user may be artificial intelligence.

REFERENCE SIGNS LIST

1: Charged particle beam device
2: Lens barrel
3: Electron gun
4: Condenser lens
5: Deflection coil
6: Objective lens
7: Sample chamber
8: Stage
9: Holder
10: Secondary electron detector
11: Reflection electron detector
12: Optical camera
13: Vacuum pump
20: Monitor
21: Mouse
22: Trackball
31: Selection screen
32: Low magnification image display unit
33: Low magnification image (photographed image)
34 to 44: Button
45, 46: Check box
47: Continuous photographing setting area
48: Cursor
50: Confirmation screen
51: Confirmation button
52: Modification button
53: Fix button
54: Autofocus shift area (AF shift area)
55: Automatic continuous photographing area (plurality of photographing visual fields)
56: Check box
60: Scheduled visual field (photographing visual field)
61: Designated visual field (photographing visual field)
62: Adjustment visual field (photographing visual field)
63: Completed visual field (photographing visual field)
64: Focus value calculation visual field
65: Outer shape
70: Recording table 71: Output screen
72: Stitched image display unit
73: Stitched image (photographed image)
74: 2D/3D switching button
75: Save button
76: Topography image
C0 to C4: Control unit
MD: Storage medium
OA: Optical axis
S1 to S10, S21 to S30: Step
SAM: Sample

The invention claimed is:

1. A charged particle beam device comprising:
an electron gun capable of emitting an electron beam;
an objective lens for focusing the electron beam;
a stage for installing a sample;
a detector capable of detecting secondary electrons or reflection electrons emitted from the sample as a signal when the sample is installed on the stage and the sample is irradiated with the electron beam at the time of analysis of the sample;
a control unit electrically connected to the electron gun, the objective lens, the stage, and the detector, and having an image processing control circuit capable of converting the signal detected by the detector into a photographed image;
a photographing function for automatically continuously photographing each of a plurality of photographing visual fields in the sample, which are analysis targets, as the photographed image at the time of analysis of the sample; and
an autofocus function for automatically focusing each of the plurality of photographing visual fields and automatically calculating focus values thereof at the time of analysis of the sample, wherein
each of the plurality of photographing visual fields is focused in a first focus value calculation visual field adjacent to the photographing visual field designated as a photographing target among the plurality of photographing visual fields, and
the focus value calculated in the first focus value calculation visual field is used for calculating the focus values of each of the plurality of photographing visual fields.

2. The charged particle beam device according to claim 1, wherein
the first focus value calculation visual field is a shift area in the sample, which is not an analysis target.

3. The charged particle beam device according to claim 1, wherein
the first focus value calculation visual field is the photographing visual field that has already been photographed among the plurality of photographing visual fields.

4. The charged particle beam device according to claim 1, wherein
each of the plurality of photographing visual fields is focused in the first focus value calculation visual field and in an adjacent second focus value calculation visual field at a position different from the first focus value calculation visual field in the photographing visual field designated to the photographing target among the plurality of photographing visual fields, and
a focus value calculated in the first focus value calculation visual field and a focus value calculated in the second focus value calculation visual field are used for calculating the focus values of each of the plurality of photographing visual fields.

5. The charged particle beam device according to claim 4, wherein
the first focus value calculation visual field is a shift area in the sample, which is not an analysis target, and
the second focus value calculation visual field is the photographing visual field that has already been photographed among the plurality of photographing visual fields.

6. The charged particle beam device according to claim 4, wherein
each of the first focus value calculation visual field and the second focus value calculation visual field is a shift area in the sample, which is not an analysis target.

7. The charged particle beam device according to claim 4, wherein
each of the first focus value calculation visual field and the second focus value calculation visual field is a photographing visual field that has already been photographed among the plurality of photographing visual fields.

8. The charged particle beam device according to claim 1, wherein
a plurality of the detectors are provided to face the sample from directions different from each other at the time of analysis of the sample,
the control unit is capable of outputting a topography image on a monitor provided inside or outside the charged particle beam device, and
the topography image is created by stitching the photographed images of each of the plurality of photographing visual fields based on coordinates of the stage corresponding to the focus values obtained by focusing each of the plurality of photographing visual fields.

9. The charged particle beam device according to claim 1, wherein
the control unit outputs a first display unit for displaying a low magnification image of the sample including the plurality of photographing visual fields, a first button for photographing the low magnification image, a second button for outputting image data of the low magnification image photographed outside the charged particle beam device, and a third button for adding a continuous photographing setting area of the sample to the low magnification image, to a first screen on the monitor provided inside or outside the charged particle beam device,
the low magnification image is displayed on the first display unit when the user clicks the first button or the second button, and
the continuous photographing setting area is displayed on the low magnification image when the user clicks the third button.

10. The charged particle beam device according to claim 9, further comprising:
an optical camera electrically connected to the control unit, wherein
an optical image photographed by the optical camera is displayed as the low magnification image on the first display unit when the user clicks the first button.

11. The charged particle beam device according to claim 9, wherein
the control unit further outputs a first check box for setting a shift area in the sample, which is not an analysis target, and a fourth button for completing the setting of the continuous photographing setting area, to the first screen,
when the user clicks the fourth button while the first check box is checked, the control unit outputs the first display unit on which the low magnification image and the continuous photographing setting area are displayed, a fifth button for confirming the plurality of photographing visual fields and the shift area, and a sixth button for modifying the shift area, to a second screen on the monitor,
when the user clicks the fifth button, the plurality of photographing visual fields arranged to include the inside of the continuous photographing setting area, and the shift area arranged outside the continuous photographing setting area, are displayed on the first display unit,
when the user clicks the sixth button, position, number, and shape of the shift area are modifiable in any manner, and
the shift area is usable as the first focus value calculation visual field.

12. The charged particle beam device according to claim 11, wherein
the control unit further outputs a second check box for performing focusing in two or more first focus value calculation visual fields for one photographing visual field, to the second screen.

13. The charged particle beam device according to claim 11, wherein
the control unit further outputs a magnifying button for magnifying and displaying the low magnification image and a reducing button for reducing and displaying the low magnification image, to the first screen and the second screen.

* * * * *